(12) United States Patent
Park

(10) Patent No.: US 7,842,980 B2
(45) Date of Patent: Nov. 30, 2010

(54) IMAGE SENSOR MICROLENS STRUCTURES AND METHODS OF FORMING THE SAME

(75) Inventor: Jin-Hyeong Park, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 12/402,570

(22) Filed: Mar. 12, 2009

(65) Prior Publication Data

US 2009/0179289 A1 Jul. 16, 2009

Related U.S. Application Data

(63) Continuation of application No. 11/287,362, filed on Nov. 28, 2005, now Pat. No. 7,524,770.

(30) Foreign Application Priority Data

Nov. 29, 2004 (KR) .............................. 2004-98665

(51) Int. Cl.
*H01L 27/148* (2006.01)

(52) U.S. Cl. ...................... 257/232; 257/233; 257/432; 257/440

(58) Field of Classification Search ................. 257/232, 257/233, 432, 440

See application file for complete search history.

(56) References Cited

U.S. PATENT DOCUMENTS

| | | | |
|---|---|---|---|
| RE31,780 E | | 12/1984 | Cooper et al. |
| 5,202,282 A | | 4/1993 | Son |
| 5,466,926 A | * | 11/1995 | Sasano et al. ............... 250/216 |
| 5,895,943 A | * | 4/1999 | Park et al. .................. 257/232 |
| 6,030,852 A | * | 2/2000 | Sano et al. .................. 438/69 |
| 2001/0033007 A1 | | 10/2001 | Lee |
| 2002/0048840 A1 | | 4/2002 | Tanigawa |
| 2008/0135962 A1 | | 6/2008 | Ryu |

FOREIGN PATENT DOCUMENTS

| | | |
|---|---|---|
| JP | 61-141139 A | 6/1986 |
| JP | 06-125070 | 5/1994 |
| JP | 10-270672 | 10/1998 |
| JP | 2000-357786 | 12/2000 |
| JP | 2003-075625 A | 3/2003 |
| JP | 05-232462 A | 7/2003 |

(Continued)

OTHER PUBLICATIONS

Usoskin et al., "Silicon nitride films: Optical properties and possibility of applications in multilayer interference systems", Journal of Applied Spectroscopy, vol. 43, No. 5/ Nov. 1985, pp. 1268-1271.

(Continued)

*Primary Examiner*—Long Pham
(74) *Attorney, Agent, or Firm*—Volentine & Whitt, P.L.L.C.

(57) ABSTRACT

An image sensor includes a light receiving device in a substrate, a color filter over the light receiving device, a buffer film over the color filter, and a microlens on the buffer film. The microlens has a concave bottom face and a convex top face. The buffer film has a substantially flat top outside the microlens and has a convex top face below the microlens.

14 Claims, 3 Drawing Sheets

FOREIGN PATENT DOCUMENTS

| | | |
|---|---|---|
| JP | 2003-209230 A | 7/2003 |
| KR | 1020020017840 A | 3/2002 |
| KR | 1020020042098 A | 6/2002 |
| KR | 1020030037883 A | 5/2003 |

OTHER PUBLICATIONS

Notice to File a Response/Amendment to the Examination Report from the Korean Intellectual Property Office dated Aug. 31, 2006.

* cited by examiner

IMAGE SENSOR MICROLENS STRUCTURES AND METHODS OF FORMING THE SAME

CROSS-REFERENCE TO RELATED APPLICATIONS

This application is a continuation application of application Ser. No. 11/287,362 filed on Nov. 28, 2005, which is hereby incorporated for all purposes.

BACKGROUND OF THE INVENTION

1. Field of the Invention

The present invention generally relates to semiconductor devices and method of forming the same, and in particular, the present invention relates to the microlens structure of image sensors and to methods of forming the same.

A claim of priority under 35 U.S.C. §119 is made to Korean Patent Application No. 2004-98665, filed on Nov. 29, 2004, the entire contents of which are hereby incorporated by reference.

2. Description of the Related Art

The digital camera is a popular example of a device which utilizes image sensor having an optical microlens and a light receiving element. Light incident on the microlens is focused towards the light receiving element which transforms the light into an electrical signal capable of image processing.

The image sensor is usually composed of a large two-dimensional pixel array, where each pixel includes an optical microlens and a light receiving element. In addition, transmission and signally devices are provided to read out the images of the image sensor. Most image sensors can be classified as either charge-coupled-device type image sensors (CCD images sensor) or complementary metal-oxide-semiconductor (CMOS) image sensors (CIS).

In both CIS and CCD image sensor, as the integration density continues to increase, the spacing between adjacent pixels is becoming narrower. As a result, light incident at a target pixel tends to outflow toward an adjacent pixel. The problem is explained below in more detail with reference to FIG. 1.

Referring to FIG. 1, the conventional image sensor includes a light shielding layer 104 located within interlayer insulation films 105a and 105b. The light shielding layer 104 is intended to prevent light from being incident on a region 103 external the light receiving devices 102a, 102b, and 102c. Color filters 106a, 106b, and 106c are arranged over the light shielding layer 104. On the color filters 106a~106c, a protection film 107 having a flattened top surface is formed for planarization and improving optical transmittance. Also, microlenses 108a, 108b, and 108c are arranged on the protection film 107 to concentrate light thereon.

In general, the light receiving devices 102a~102c are formed of photo gates or photodiodes. The light shielding layer 104 is formed of metal. The color filters 106a~106c are made of dyed photoresist materials. The microlenses 108a~108c are mostly formed with using polymer resins, and the protection film 107 is usually made of silicon oxide that has a refractive index similar to that of the microlens.

In such a conventional image sensor, one side (upper surface) of the microlens (e.g., one of 108a~108c) is shaped with a convex curvature, whereas the other side (lower surface that faces the protection film 107) is flat. In other words, the conventional microlens is configured with a unilateral convex top surface. The refractive index of the protection film 107 is substantially equal to that of the microlenses 108a~108c. Thus, as shown in FIG. 1, a focal distance $d_{F1}$ of the microlens is shorter than a distance $d_{A1}$ from the microlens to the light receiving device. It means that a focus F of the microlens is settled on a position spaced well away from the light receiving device. As a result, the focusing efficiency is degraded and light rays are likely to be incident on adjacent light receiving devices.

SUMMARY OF THE INVENTION

According to an aspect of the present invention, an image sensor is provided which includes a microlens having a convex top face, and a buffer film having a convex top face, where the convex top face of the buffer film contacting a concave bottom face of the microlens, and where a refractive index of the buffer film is less than a refractive index of the microlens.

According to another aspect of the present invention, an image sensor is provided which includes an interlayer insulation film formed over a substrate including a light receiving device, a color filter formed over the interlayer insulation film, a protection film having a flat top face formed over the interlayer insulation film and the color filter, a buffer film having a convex top face formed over the protection film, and a microlens formed on the convex top face of the buffer film. The microlens has a refractive index which is greater than a refractive index of the buffer film and has a convex top face and a concave bottom face, where the concave bottom face of the microlens contacts the convex top face of the buffer film.

According to still another aspect of the present invention, a method of forming an image sensor is provided which includes forming a buffer film over a substrate to have a flat top face, dry-etching the buffer film to contour the buffer film into having a convex top face, and forming a microlens on the convex top face of the buffer film, where the microlens has a concave bottom face located on the convex top face of the buffer film.

According to yet another aspect of the present invention, a method of forming an image sensor is provided which includes forming an interlayer insulation film over a substrate including light receiving devices, forming color filters over the interlayer insulation film and aligned over the light receiving devices, forming a buffer film over the interlayer insulation film which covers the color filters and which has convex top faces aligned over the color filters, and forming microlenses on the convex top faces of the buffer film. The microlenses has a refractive index which is greater than a refractive index of the buffer film.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
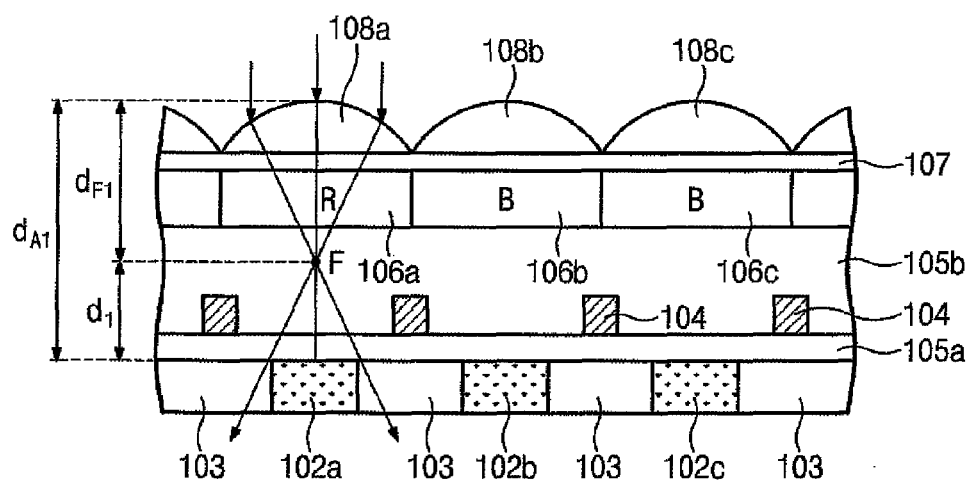
FIG. 1 is a sectional diagram for using in explaining drawbacks encountered in a conventional image sensor.

Preferred embodiments of the present invention will be described below in detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the drawings and specification.

It will be understood that, although the terms for first, second, third, etc. may be used herein to describe various elements such as region, film, layer, etc., these elements should not be limited by these terms. These terms are only used to distinguish one element from another. For example, a first layer could be termed a second layer, and, similarly, a second layer could be termed a first layer without departing from the teaching of this disclosure. In the drawings, the thicknesses of layers and regions may be exaggerated for clarity. It will also be understood that when a layer is referred to as being on another layer or substrate, it can be directly on the other layer or substrate, or intervening layers may also be present.

Some embodiments described herein are directed to an image sensor which is capable of enhancing focusing efficiency by increasing a focal distance. The focal distance can be increased by using a microlens having double-sided curvatures. The focal distance may be further increased by forming a buffer film under the microlens which has a refractive index that is lower than that of the microlens. In some embodiments, a concave bottom surface of the microlens is formed on a convex top face of the buffer film.

Figure 2:
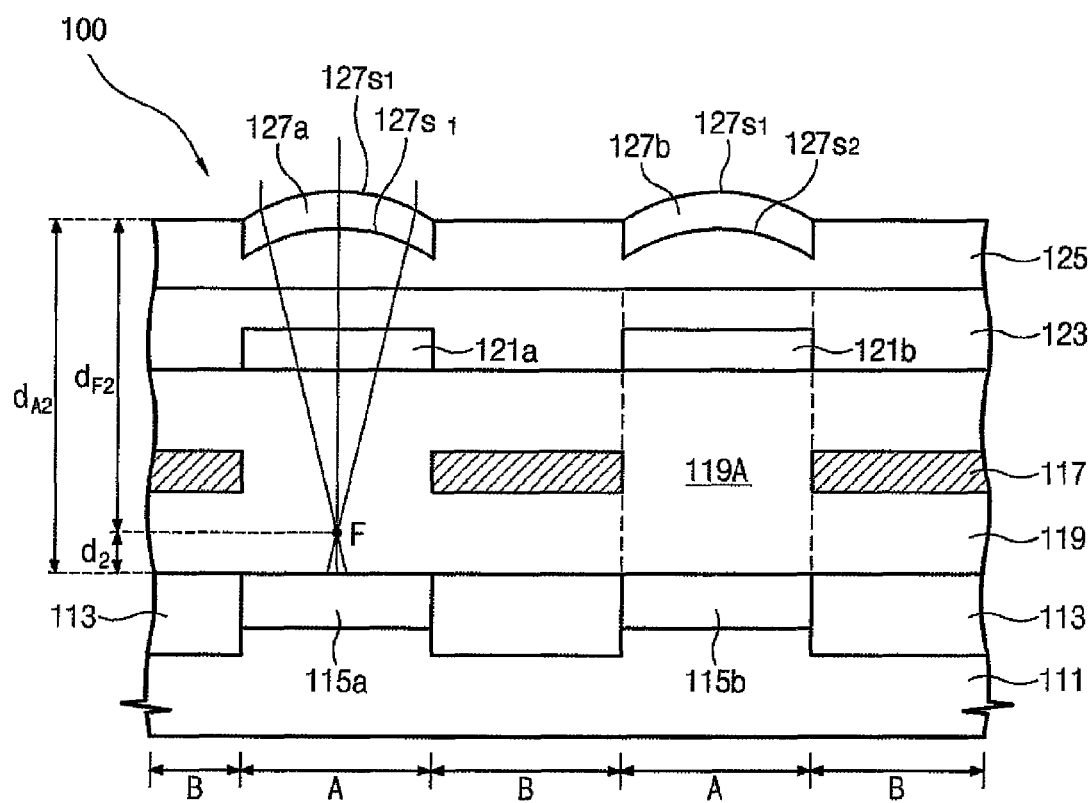
FIG. 2 is a sectional diagram illustrating the structure of an image sensor in accordance with an exemplary embodiment of the present invention.

FIG. 2 is a cross-sectional diagram illustrating the structure of an image sensor 100 having a microlens with double-sided curvatures in accordance with an embodiment of the invention.

In FIG. 2, reference character "A" denotes a light transmission region in which a light receiving device is positioned, and reference character "B" denotes a light shielding region in which metal connections, transistors, and shielding patterns are arranged. The light shielding region B may also include logic circuits. Although the image sensor 100 will typically include a large array of light receiving devices, only two such devices are shown in the FIG. 2 for simplicity of the description.

Referring to FIG. 2, the image sensor 100 of this example includes a substrate 111 including light receiving devices 115a and 115b, an interlayer insulation film 119 in which metal connections 117 are formed, color filters 121a and 121b, a protection film 123, a buffer film 125, and microlenses 127a and 127b.

The light receiving devices 115a and 115b are formed in the light transmission region A of the substrate 111 and are electrically isolated from each other by field isolation regions 113. As suggested above, an array of light receiving devices 115a and 115b are arranged on the substrate 111 in rows and columns. The light receiving devices 115a and 115b may be configured as one or more of a variety of different light receiving device types, and examples include photodiodes, phototransistors, pinned photodiodes, photogates, and MOS-FETs. In the case of a photodiode, an N-type epitaxial silicon layer is grown in a P-type substrate and then N-type ion impurities are implanted into the N-type epitaxial silicon layer. Thereby, an N-type region of the photodiode is formed therein. Subsequently, P-type ion impurities are implanted into the surface of the N-type region to form a P-type region of the photodiode. Signal charges are accumulated in the N-type region of the photodiode. A deep P-type well can be formed as a barrier layer between the P-type substrate and N-type epitaxial silicon layer. The deep P-type well can be formed by implanting impurities after forming the N-type epitaxial silicon layer.

Signal charges generated in the light receiving devices 115a and 115b are transferred by transistors (not shown) typically formed in the light shielding region B and then read by a logic circuit (not shown).

The interlayer insulation film 119 is formed of silicon oxide which may or may not be doped with impurities. Silicon oxide can be generally classified as either a low temperature oxide (LTO), a middle temperature oxide (MTO), or a high temperature oxide (HTO), depending on fabrication temperature. An "LTO" silicon oxide has a refractive index which is lower than 1.5 and is formed at a temperature of about 100 to 150° C. Conventionally, an "interlayer insulation film" is formed of MTO or HTO, each of which has a higher refractive index (e.g., about 1.5 or more) than LTO and each of which is formed with different fabrication conditions than LTO. For example, MTO and HTO are formed at higher temperatures than that of LTO, and with different source gases and pressures than LTO.

On the interlayer insulation film 119, the color filters 121a and 121b are disposed. Color filters 121a and 121b are respectively aligned over the light receiving devices 115a and 115b. Likewise, microlenses 127a and 127b are respectively aligned over the color filters 121a and 121b with the protection film 123 and the buffer film 125 interposed there between.

The top faces of portions of the buffer film 125 are convex. The top faces 127s1 of the microlenses 127a and 127b are convex, while the bottom faces 127s2 of the microlenses 127a and 127b are concave. The curvatures of the bottom faces 127s2 may be generally dependent on or correspond to the curvatures of the top faces 127s1. In other words, both sides of the microlens 127a or 127b define surface curvatures (convex and concave). As a result, it can be seen (by tracing the optical path of incident light) that a focal distance $d_{F2}$ is longer than that of the conventional image sensor shown in FIG. 1. Thus, a distance $d_2$ between the focus F and the light receiving device in the image sensor of the present embodiment can be made shorter than the distance $d_1$ of the conventional image sensor shown in FIG. 1. Also, it is possible to make the total distance $d_{A2}$ between the microlens and the light receiving element longer in the present embodiment than the corresponding distance $d_{A1}$ of the conventional sensor shown in FIG. 1. These advantages result increasing the distance dF2 of the focus F by providing the bottom faces 127s2 of the microlens 127a and 127b with concave surface curvatures. In order to further increase focal distance $d_{F2}$, the radius of curvature of the bottom surface 127s2 can be made smaller than that of the top surface 127s1.

Still referring to FIG. 2, the buffer film 125 contacts the microlenses 127a and 127b and has a refractive index which is lower than that of the microlenses 127a and 127b. In this manner, the focal distance $d_{F2}$ may be increased even further, which enables the focus F of the microlens 127a or 127b to be closely adjacent the light receiving device 115a or 115b. Comparably, in the conventional image sensor shown in FIG.

1, the refractive index of the protection film contacting to the microlenses is similar to that of the microlens.

The microlenses 127a and 127b may, for example, be formed of a polymer resin having a refractive index of about 1.5, or a photoresist material. The buffer film 125 may be formed of an LTO having a refractive index of 1.43 to 1.45, or a polymer having a refractive index of 1.33 to 1.35. Here, the LTO film may be formed by a low-temperature chemical vapor deposition (LPCVD) process, e.g., at a low temperature of 100 to 150° C. in an atmosphere of silane and oxygen source gases. A polymer buffer film 125 may be formed at a temperature under 200° C.

The protection film 123 is interposed between the buffer film 125 and the color filters 121a and 121b, and has a flattened top face. The protection film 123 may be formed of silicon oxide which may be the same as the interlayer insulation film 119, having a refractive index higher than that of the buffer film 125.

Preferably, the refractive index of the buffer film 125 is lower than those of the microlenses 127a and 127b and the protection film 123.

The protection film 123 may be formed of an LTO. Furthermore, the interlayer insulation film 119 may be formed of an LTO. Such coincidence of materials among the films 119, 123, and 125 may enhance focusing efficiency in the image sensor 100. In addition, the interlayer insulation film 119A on the light receiving region A may be selectively formed of the LTO film. In forming the interlayer insulation film 119A, the interlayer insulation film 119 is first formed of a silicon oxide and then partially removed on the light receiving region A by means of photolithography. Next, an LTO film is deposited where the interlayer insulation film 119 has been removed, resulting in the interlayer insulation film 119A.

A method of forming the microlens structures of the image sensor 100 shown in FIG. 2 will now be described with reference to FIGS. 3 through 6. FIGS. 3 through 6 are presented here to explain an exemplary process of fabricating the microlenses only, while techniques for manufacturing of the underlying structures of the image sensor 100 will be well understood by those skilled in the art from the foregoing description.

Figure 3:
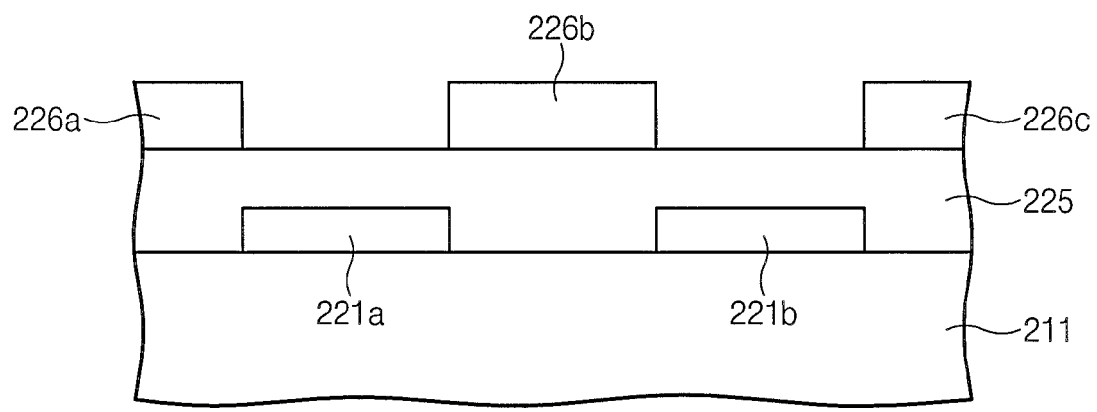
FIGS. 3 through 6 are sectional diagrams for use in explaining a method of manufacturing the image sensor illustrated in FIG. 2 in accordance with an exemplary embodiment of the present invention.

First, referring to FIG. 3, color filters 221a and 221b are formed on a substrate 211 in which light receiving devices, transistors, metal connections, and interlayer insulation films have been already formed. The color filters 221a and 221b may be formed by well-known methods, e.g., they may be formed of a dyed photoresist.

A buffer film 224 is deposited covering the color filters 221a and 221b. The buffer film 225 is made of a polymer or an LTO film. A polymer buffer film 225 has a refractive index of 1.33 to 1.35 which is lower than that of the interlayer insulation film disposed under the buffer film 225. An LTO buffer film 225 has a refractive index of 1.43 to 1.45 which is also lower than that of the interlayer insulation film.

Mask pattern 226a~226c is then formed on the buffer film 225. As illustrated, the mask pattern 226a~226c includes openings which expose portions of the buffer film 225 aligned over the color filters 221a and 221b. The mask pattern 226a~226c may be formed of a photoresist.

Although not shown, it may be preferable to form a flattened protection film before depositing the buffer film 225. The flattened protection film may be helpful in improving topology when later forming the mask pattern 226a~226c on the buffer film 225.

Figure 4:
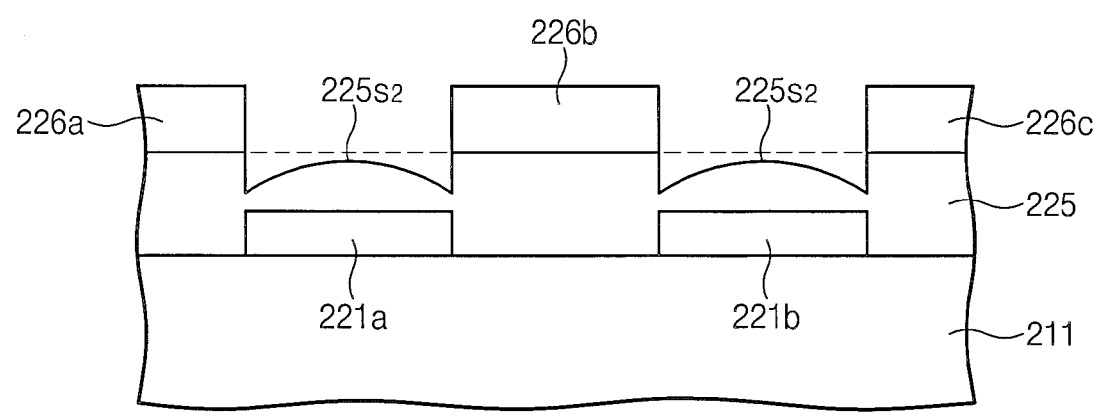

Next, referring to FIG. 4, exposed portions of the buffer film 225 are partially removed by way of a dry etching process. It is possible to adjust an etch rate of the buffer film 225, by using carbon-fluoride based gas and oxygen gas, in accordance with a relative position of the buffer film exposed by the mask pattern. The carbon-fluoride based gas may contain $C_4F_8$ as an example. The etch rate can be controlled so as to decrease in a direction away from the edges of the mask pattern 226a~226c. Accordingly, parts of the buffer film contacting and closely adjacent the edges of the mask pattern 226a~226c are more rapidly removed than other parts spaced farther from the edges. As a result of such dry etching techniques, as shown in FIG. 4, the resultant pattern of the buffer film 225 is configured with convex top faces 225s2 aligned over the color filters 221a and 221b.

In the dry etching process, the oxygen gas pressure can be adjusted to be higher than that of the carbon-fluoride based gas, such that the top faces of the buffer film 225 become more convex. The more convex the top faces of the buffer film 225, the smaller the radius of curvature of the buffer film 225. The smaller radius of curvature of the buffer film 225, the higher the focusing efficiency of the image sensor.

Figure 5:
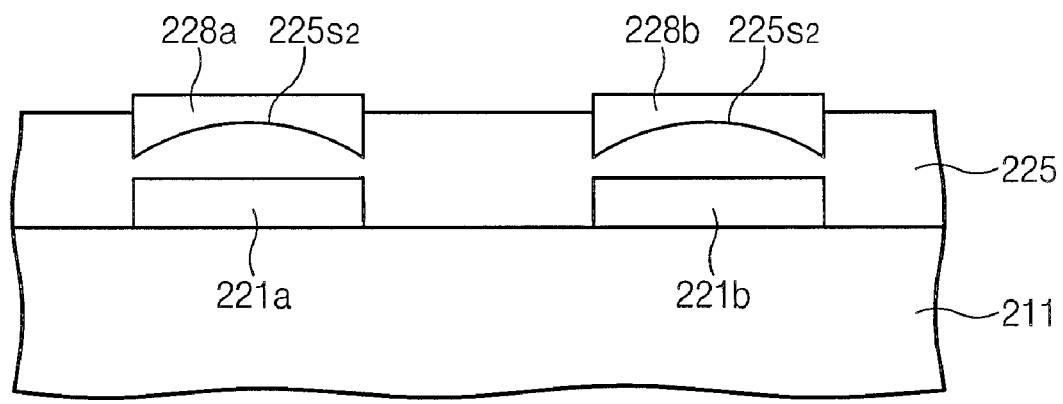

Referring now to FIG. 5, after removing the mask pattern 226a~226c, microlens material is deposited on the buffer film 225, and microlens patterns 228a and 228b are formed by exposing and patterning processes. The microlens material is selected so as to have an index of refraction which is greater than that of the buffer film 225. The bottom faces of the microlens patterns 228a and 228b contact the convex top faces 225s2 of the buffer film 225. As a result, each of the microlens pattern 228a and 228b has a concave bottom face which conforms to the shape of the convex top face 225s2 of the buffer film 225.

Figure 6:
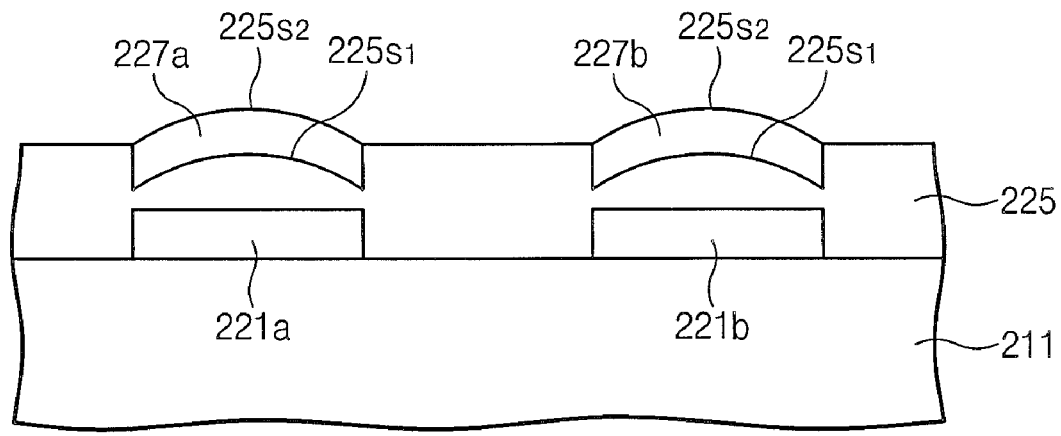

Next, referring to FIG. 6, the microlens patterns 228a and 228b are subjected to heat treatment to cause re-flow of the microlens material. The re-flow process is conducted under the temperature that permits mobility (i.e., flowing ability) of the microlens material. As a result, the top faces of the microlens patterns 228a and 228b are deformed into microlenses 227a and 227b each having a convex top face 225s2.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. An image sensor, comprising:
    a light receiving device in a substrate;
    a color filter over the light receiving device;
    a buffer film over the color filter; and
    a microlens on the buffer film, the microlens having a concave bottom face and a convex top face.
    wherein the buffer film has a substantially flat top outside the microlens and has a convex top face below the microlens, and
    wherein a refractive index of the buffer film is less than a refractive index of the microlens.

2. The image sensor as set forth in claim 1, further comprising:
    a protection film contacting the buffer film and having a flat top face under the microlens and outside the microlens.

3. The image sensor as set forth in claim 2, wherein a refractive index of the protection film is greater than a refractive index of the buffer film.

4. The image sensor as set forth in claim 2, wherein the protection film comprises silicon oxide having a refractive index of about 1.5.

5. The image sensor as set forth in claim 2, wherein the microlens comprises a polymer resin having a refractive index of about 1.5, and the buffer film comprises a low-temperature oxide (LTO) film having a refractive index in a range of 1.43 to 1.45 or a polymer having a refractive index in a range of 1.33 to 1.35.

6. The image sensor as set forth in claim 1, wherein the microlens comprises a polymer resin having a refractive index of about 1.5.

7. The image sensor as set forth in claim 1, wherein the buffer film comprises a low-temperature oxide (LTO) film having a refractive index in a range of 1.43 to 1.45 or a polymer having a refractive index in a range of 1.33 to 1.35.

8. An image sensor, comprising:
a plurality of light receiving devices in a substrate;
a plurality of color filters over the plurality of light receiving devices;
a buffer film over the color filter; and
a plurality of spaced apart microlenses on the buffer film, each of the plurality of spaced apart microlenses having a concave bottom face and a convex top face,
wherein the buffer film has a substantially flat top face between adjacent microlenses and has a convex top face below each microlens, and
wherein a refractive index of the buffer film is less than a refractive index of the microlens.

9. The image sensor as set forth in claim 8, further comprising:
a protection film contacting the buffer film and having a flat top face under each microlens and between adjacent microlenses.

10. The image sensor as set forth in claim 9, wherein a refractive index of the protection film is greater than a refractive index of the buffer film.

11. The image sensor as set forth in claim 9, wherein the protection film comprises silicon oxide having a refractive index of about 1.5.

12. The image sensor as set forth in claim 9, wherein each microlens comprises a polymer resin having a refractive index of about 1.5, and the buffer film comprises a low-temperature oxide (LTO) film having a refractive index in a range of 1.43 to 1.45 or a polymer having a refractive index in a range of 1.33 to 1.35.

13. The image sensor as set forth in claim 8, wherein each microlens comprises a polymer resin having a refractive index of about 1.5.

14. The image sensor as set forth in claim 8, wherein the buffer film comprises a low-temperature oxide (LTO) film having a refractive index in a range of 1.43 to 1.45 or a polymer having a refractive index in a range of 1.33 to 1.35.

* * * * *